(12) United States Patent
Booth, Jr. et al.

(10) Patent No.: US 7,759,766 B2
(45) Date of Patent: Jul. 20, 2010

(54) ELECTRICAL FUSE HAVING A THIN FUSELINK

(75) Inventors: Roger A. Booth, Jr., Wappingers Falls, NY (US); MaryJane Brodsky, Salt Point, NY (US); Kangguo Cheng, Beacon, NY (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 503 days.

(21) Appl. No.: 11/843,047

(22) Filed: Aug. 22, 2007

(65) Prior Publication Data

US 2009/0051002 A1 Feb. 26, 2009

(51) Int. Cl.
*H01L 29/00* (2006.01)

(52) U.S. Cl. ............... 257/529; 257/209; 257/E21.002; 438/132

(58) Field of Classification Search .............. 438/132; 257/209, 529, E21.002
See application file for complete search history.

(56) References Cited

U.S. PATENT DOCUMENTS

| | | | |
|---|---|---|---|
| 4,374,371 A | 2/1983 | Narancic | |
| 4,893,106 A | 1/1990 | Goldstein et al. | |
| 4,973,932 A | 11/1990 | Krueger et al. | |
| 4,984,054 A | 1/1991 | Yamada et al. | |
| 5,148,140 A | 9/1992 | Goldstein | |
| 5,659,284 A | 8/1997 | Olofsson | |
| 6,252,292 B1 | 6/2001 | Brintzinger et al. | |
| 6,323,535 B1 | 11/2001 | Iyer et al. | |
| 6,368,902 B1 | 4/2002 | Kothandaraman et al. | |
| 6,420,216 B1 | 7/2002 | Clevenger et al. | |
| 6,432,760 B1 | 8/2002 | Kothandaraman et al. | |
| 6,433,404 B1 | 8/2002 | Iyer et al. | |
| 6,436,585 B1 | 8/2002 | Narayan et al. | |
| 6,501,150 B2 | 12/2002 | Welser | |
| 6,624,499 B2 | 9/2003 | Kothandaraman et al. | |
| 6,787,878 B1 | 9/2004 | Nagai et al. | |
| 6,897,543 B1 | 5/2005 | Huang et al. | |
| 6,903,436 B1 | 6/2005 | Luo et al. | |
| 6,933,591 B1* | 8/2005 | Sidhu et al. ................. | 257/665 |
| 7,002,219 B1 | 2/2006 | de Jong et al. | |
| 7,157,782 B1 | 1/2007 | Shih et al. | |
| 7,576,407 B2* | 8/2009 | Ko et al. ..................... | 257/529 |
| 2002/0120218 A1* | 8/2002 | Oba et al. ....................... | 601/2 |
| 2003/0025177 A1 | 2/2003 | Kothandaraman | |
| 2007/0029576 A1* | 2/2007 | Nowak et al. ............... | 257/209 |
| 2007/0099326 A1 | 5/2007 | Hsu et al. | |
| 2007/0210412 A1* | 9/2007 | Booth et al. ................ | 257/529 |
| 2007/0273002 A1* | 11/2007 | Hwang ........................ | 257/529 |
| 2008/0179706 A1* | 7/2008 | Kim et al. ................... | 257/529 |

* cited by examiner

*Primary Examiner*—Zandra Smith
*Assistant Examiner*—Christy L Novacek
(74) *Attorney, Agent, or Firm*—Scully, Scott, Murphy & Presser, P.C.; Yuanmin Cai

(57) ABSTRACT

A thin semiconductor layer is formed and patterned on a semiconductor substrate to form a thin semiconductor fuselink on shallow trench isolation and between an anode semiconductor region and a cathode semiconductor region. During metallization, the semiconductor fuselink is converted to a thin metal semiconductor alloy fuselink as all of the semiconductor material in the semiconductor fuselink reacts with a metal to form a metal semiconductor alloy. The inventive electrical fuse comprises the thin metal semiconductor alloy fuselink, a metal semiconductor alloy anode, and a metal semiconductor alloy cathode. The thin metal semiconductor alloy fuselink has a smaller cross-sectional area compared with prior art electrical fuses. Current density within the fuselink and the divergence of current at the interface between the fuselink and the cathode or anode comparable to prior art electrical fuses are obtained with less programming current than prior art electrical fuses.

20 Claims, 9 Drawing Sheets

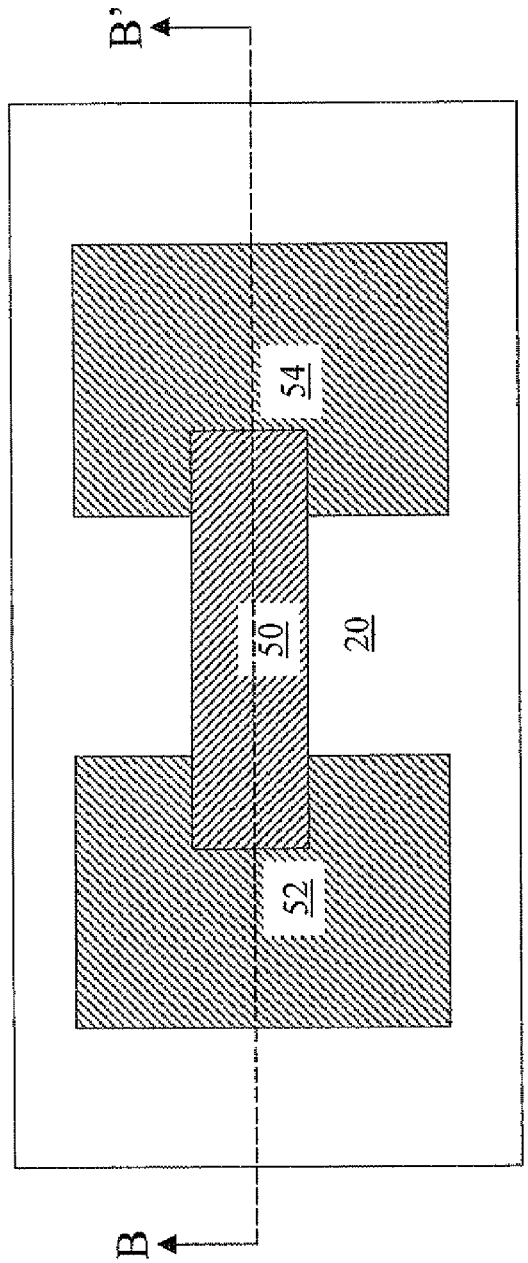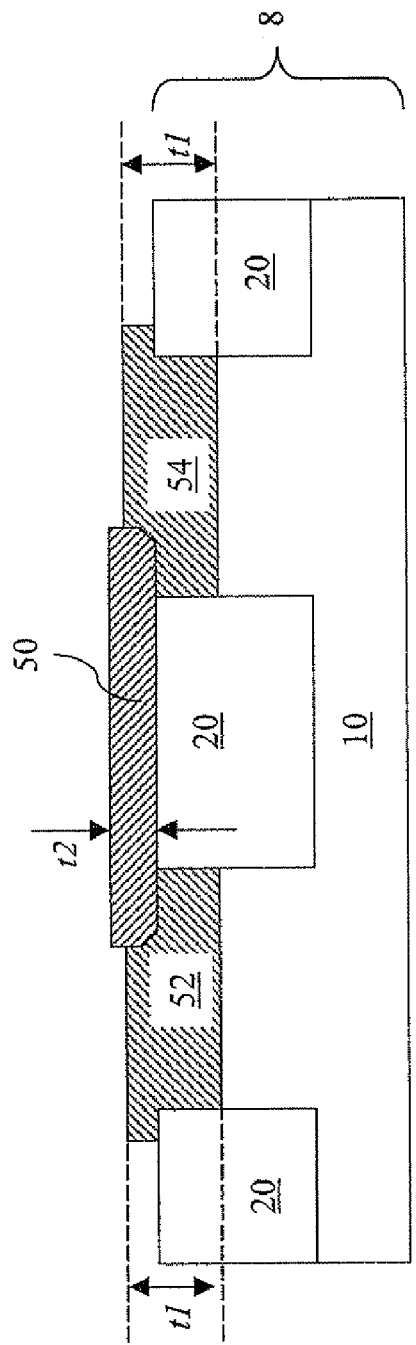
FIG. 7A
FIG. 7B

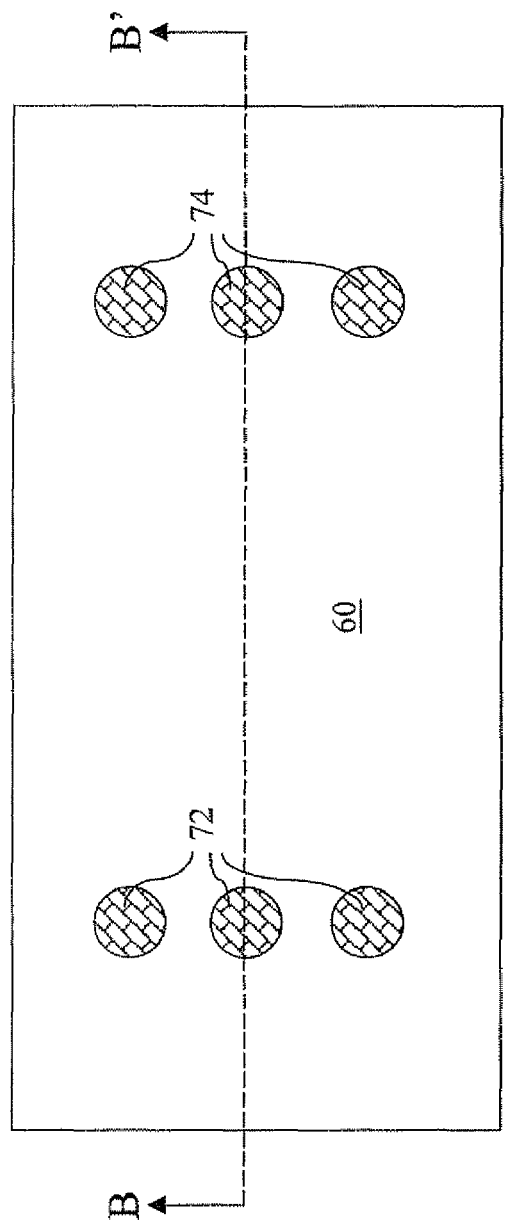
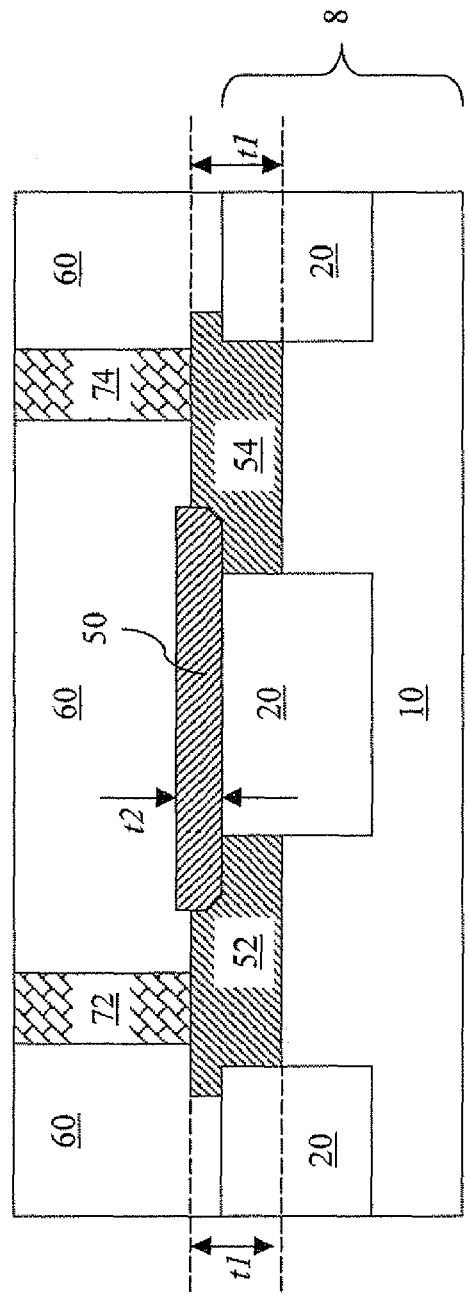
FIG. 8A
FIG. 8B

ELECTRICAL FUSE HAVING A THIN FUSELINK

FIELD OF THE INVENTION

The present invention relates to semiconductor structures, and particularly to an electrical fuse having a thin fuselink and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and an elevated temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

Referring to FIGS. 1A and 1B, a prior art electrical fuse is shown. FIG. 1A is a top-down view of the prior art electrical fuse and FIG. 1B is a vertical cross-sectional view of the prior art electrical fuse in the plane B-B' in FIG. 1A. The prior art electrical fuse comprises an anode 36, a fuselink 46, and a cathode 56, and is formed on shallow trench isolation 4 located in a semiconductor substrate 2. The anode 36 comprises an anode semiconductor 32 and an anode metal-semiconductor alloy 34. The fuselink 46 comprises a fuselink semiconductor 42 and a fuselink metal-semiconductor alloy 44. The cathode 56 comprises a cathode semiconductor 52 and a cathode metal-semiconductor alloy 54. A gate spacer 55 surrounds the prior art electrical fuse. The anode semiconductor 32, the fuselink semiconductor 42, and the cathode semiconductor 52 comprise a semiconductor material, for example polysilicon. The metal-semiconductor alloys (32, 42, 52) may be formed by metallization of the semiconductor material underneath. If the underlying semiconductor material is polysilicon, the metal-semiconductor alloys are a silicide.

The prior art electrical fuse is programmed by applying a voltage bias between the anode 36 and the cathode 56 to cause a current to flow from the anode 36 to the cathode 56. As the current passes through the fuselink 46, electromigration is induced within the fuselink 46. The current density as well as the temperature of the electromigrated region in the fuselink 46 determines the effectiveness of electromigration. In general, high temperature and high current density in the fuselink 46 are conducive to electromigration. By reducing the width of the electromigrated region in the fuselink 46, the current density and the temperature increases in the electromigrated region during programming of the electrical fuse.

Programming of the prior art electrical fuse typically takes a substantial amount of current, for example, a programming current of about 5 mA for an exemplary prior art electrical fuse having a fuselink width of about 63 nm. A programming transistor capable of supplying such a programming current typically takes up about 3 $\mu m^2$ of semiconductor area in the case of a silicon based programming transistor. Thus, the programming transistor takes up a substantial fraction of per fuse semiconductor area.

In view of the above, there is a need for an improved electrical fuse that may be programmed by a programming transistor that takes up less semiconductor area.

Particularly, there is a need for an improved electrical fuse that may be programmed with a smaller amount of programming current, and methods of manufacturing the same.

SUMMARY OF THE INVENTION

The present invention addresses the needs described above by providing an electrical fuse having a thin fuselink formed on shallow trench isolation and having a thickness that is less than a normal metal semiconductor alloy thickness.

An electrical fuse is formed on a semiconductor substrate by providing an anode semiconductor region and a cathode semiconductor region encircled by shallow trench isolation and separated by a distance. The anode semiconductor region and the cathode semiconductor region are extensions of a substrate layer comprising a semiconductor material in two of the openings in the shallow trench isolation. A thin semiconductor layer is formed and patterned on the semiconductor substrate to form a thin semiconductor fuselink across a portion of the shallow trench isolation between the anode semiconductor region and the cathode semiconductor region. The thickness of the semiconductor fuselink is set such that a metallization reaction on the semiconductor fuselink is limited by the amount of the semiconductor material available in the semiconductor fuselink.

During metallization, the semiconductor fuselink is converted to a thin metal semiconductor alloy fuselink as all of the semiconductor material in the semiconductor fuselink reacts with a metal to form a metal semiconductor alloy. Thicker metal semiconductor alloys are formed on the anode semiconductor region and the cathode semiconductor region since supply of metal limits the thickness of the metal semiconductor alloy in these regions.

The inventive electrical fuse comprises the thin metal semiconductor alloy fuselink, a metal semiconductor alloy anode, and a metal semiconductor alloy cathode. The thin metal semiconductor alloy fuselink has a smaller cross-sectional area compared with prior art electrical fuses. Current density within the fuselink and the divergence of current at the interface between the fuselink and the cathode or anode comparable to prior art electrical fuses are obtained with less programming current than prior art electrical fuses.

According to an aspect of the present invention, a semiconductor structure is provided, which comprises:

a metal semiconductor alloy anode having a first thickness and vertically abutting a substrate layer in a semiconductor substrate;

a metal semiconductor alloy cathode having the first thickness and vertically abutting the substrate layer;

shallow trench isolation located in the semiconductor substrate and laterally abutting the metal semiconductor alloy anode and the metal semiconductor alloy cathode, wherein the shallow trench isolation separates the metal semiconductor alloy anode from the metal semiconductor alloy cathode; and a metal semiconductor alloy fuselink having a second thickness and vertically abutting the shallow trench isolation, the metal semiconductor alloy anode, and the metal semiconductor alloy cathode, wherein the first thickness is greater than the second thickness.

In one embodiment, the metal semiconductor alloy anode and the metal semiconductor alloy cathode comprise the same first metal semiconductor alloy.

In another embodiment, the metal semiconductor alloy fuselink comprises a second metal semiconductor alloy, wherein the first metal semiconductor alloy and the second metal semiconductor alloy are derived from the same metal and the same semiconductor.

In even another embodiment, the second metal semiconductor alloy is more metal rich than the first metal semiconductor alloy.

In yet another embodiment, the substrate layer comprises single crystalline silicon and each of the metal semiconductor alloy anode, the metal semiconductor alloy cathode, and the metal semiconductor alloy fuselink comprises a metal silicide.

In still another embodiment, the metal silicide is selected from tungsten silicide, tantalum silicide, titanium silicide, cobalt silicide, nickel silicide, platinum silicide, osmium silicide, a silicide of other elemental metal, and an alloy thereof.

In still yet another embodiment, the substrate layer comprises single crystalline silicon-germanium alloy and each of the metal semiconductor alloy anode, the metal semiconductor alloy cathode, and the metal semiconductor alloy fuselink comprise a metal silicide-germanide alloy.

In a further embodiment, the substrate layer comprises single crystalline silicon-carbon alloy and each of the metal semiconductor alloy anode, the metal semiconductor alloy cathode, and the metal semiconductor alloy fuselink comprise a metal silicide-carbide alloy.

In an even further embodiment, the first thickness is from about 15 nm to about 50 nm, and the second thickness is from about 5 nm to about 30 nm.

In a yet further embodiment, the semiconductor structure further comprises:

a middle-of-line (MOL) dielectric layer vertically abutting the metal semiconductor alloy anode, the metal semiconductor alloy cathode, the metal semiconductor alloy fuselink, and the shallow trench isolation;

at least one anode contact via vertically abutting the metal semiconductor alloy anode; and at least one cathode contact via vertically abutting the metal semiconductor alloy cathode.

According to another aspect of the present invention, a method of forming a semiconductor structure is provided, which comprises:

forming shallow trench isolation in a semiconductor substrate and two regions of exposed semiconductor material surrounded by the shallow trench isolation;

forming a semiconductor fuselink on a portion of the shallow trench isolation between the two regions;

forming a metal semiconductor alloy anode having a first thickness and a metal semiconductor alloy cathode having the first thickness by metallizing portions of the two regions; and converting the semiconductor fuselink into a metal semiconductor alloy fuselink having a second thickness by completely metallizing the semiconductor fuselink, wherein the first thickness is greater than the second thickness.

In one embodiment, the forming of the metal semiconductor alloy anode and the metal semiconductor alloy cathode is performed at the same processing steps as the converting of the semiconductor fuselink into the metal semiconductor alloy fuselink.

In another embodiment, the forming of the semiconductor fuselink comprises:

depositing a semiconductor layer on the semiconductor substrate by a blanket deposition; and lithographically patterning and etching the semiconductor layer.

In even another embodiment, the depositing of the semiconductor layer is performed by at least one of the processes selected from chemical vapor deposition, chemical vapor deposition followed by a partial etchback, molecular beam deposition, thermal evaporation, alternating layer deposition, and physical vapor deposition.

In yet another embodiment, the metal semiconductor alloy anode and the metal semiconductor alloy cathode comprise the same first metal semiconductor alloy.

In still another embodiment, the metal semiconductor alloy fuselink comprises a second metal semiconductor alloy, wherein the first metal semiconductor alloy and the second metal semiconductor alloy are derived from the same metal and the same semiconductor.

In still yet another embodiment, the second metal semiconductor alloy is more metal rich than the first metal semiconductor alloy.

In a further embodiment, the method further comprises depositing a metal layer on the semiconductor fuselink and the two regions, wherein the metal layer is thick enough to consume all of the semiconductor fuselink during the converting of the semiconductor fuselink.

In an even further embodiment, the substrate layer comprises single crystalline silicon and each of the metal semiconductor alloy anode, the metal semiconductor alloy cathode, and the metal semiconductor alloy fuselink comprises a metal silicide.

In a yet further embodiment, the method further comprises:

forming a middle-of-line (MOL) dielectric layer directly on the metal semiconductor alloy anode, the metal semiconductor alloy cathode, the metal semiconductor alloy fuselink, and the shallow trench isolation;

forming at least one anode contact via vertically abutting the metal semiconductor alloy anode; and forming at least one cathode contact via vertically abutting the metal semiconductor alloy cathode.

BRIEF DESCRIPTION OF THE DRAWINGS

FIG. 1A is a top-down views and FIG. 1B is a vertical cross-sectional view along the plane B-B'.

FIGS. 2A-8B are sequential views of an exemplary semiconductor structure according to the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."

DETAILED DESCRIPTION OF THE INVENTION

Figure 1A:
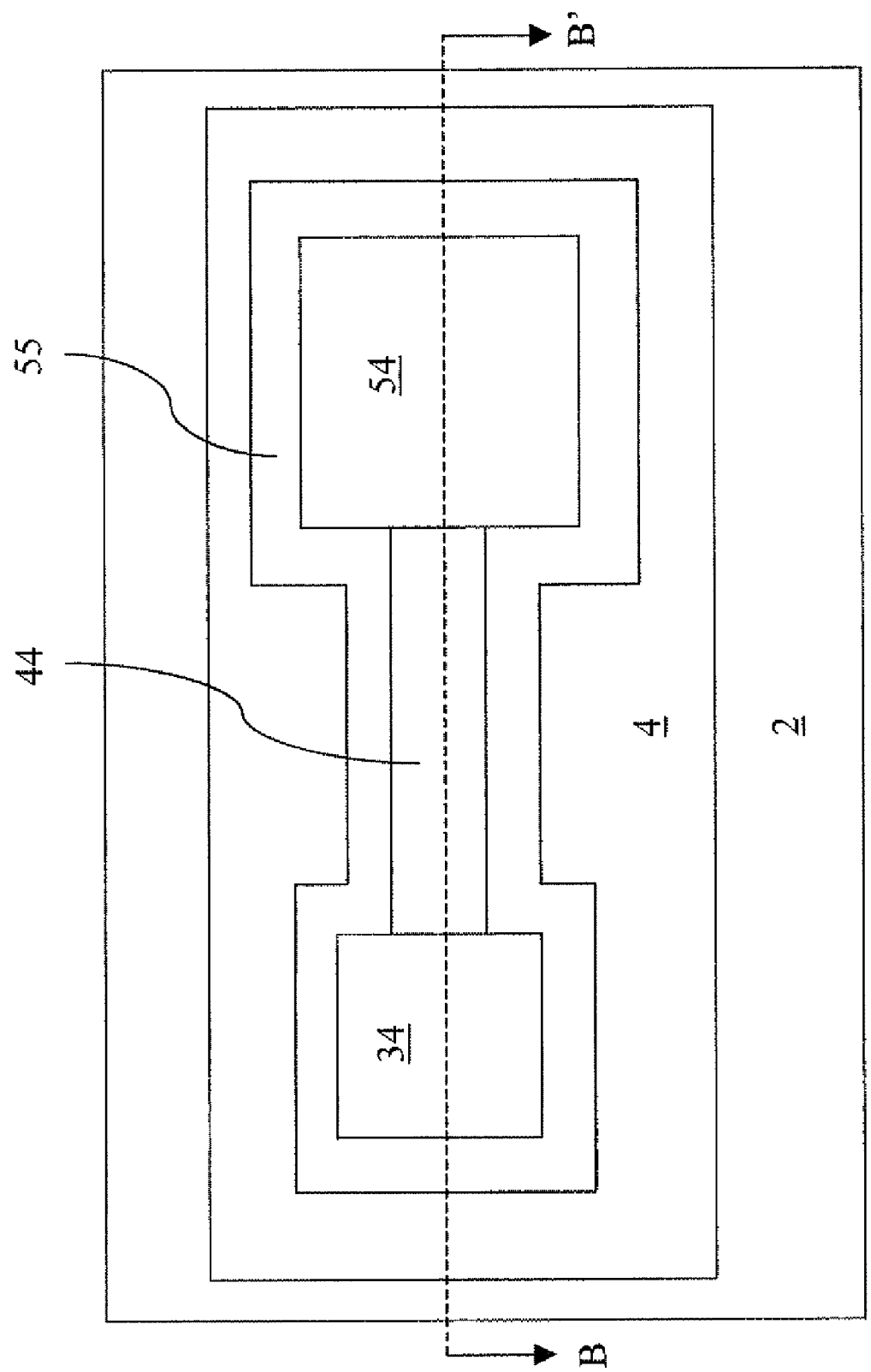
FIGS. 1A and 1B shown an exemplary prior art electrical fuse.
Figure 1B:
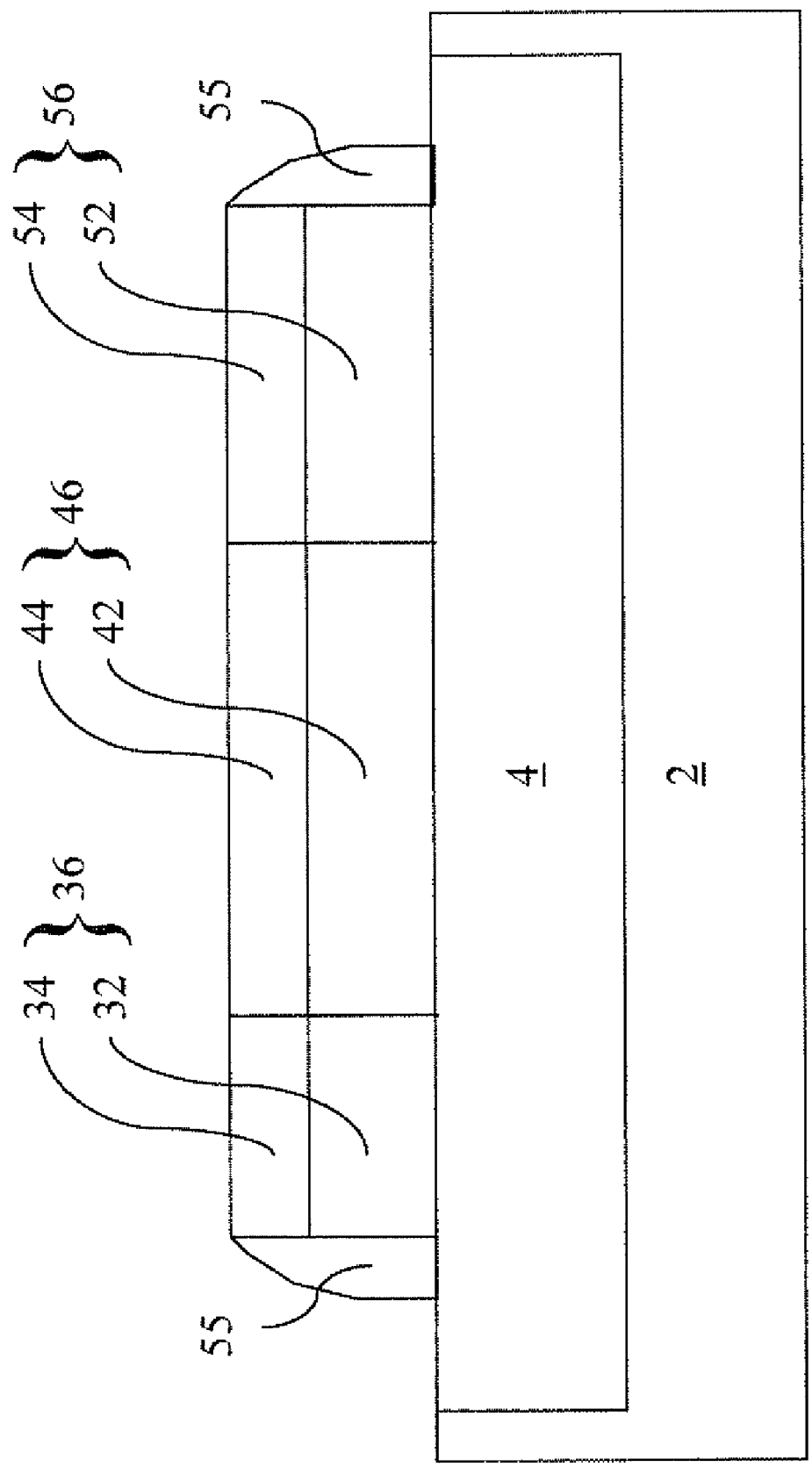

As stated above, the present invention relates to an electrical fuse having a thin fuselink and methods of manufacturing the same, which are now described in detail with accompanying figures. It is noted that like and corresponding elements are referred to by like reference numerals.

Figure 2A:
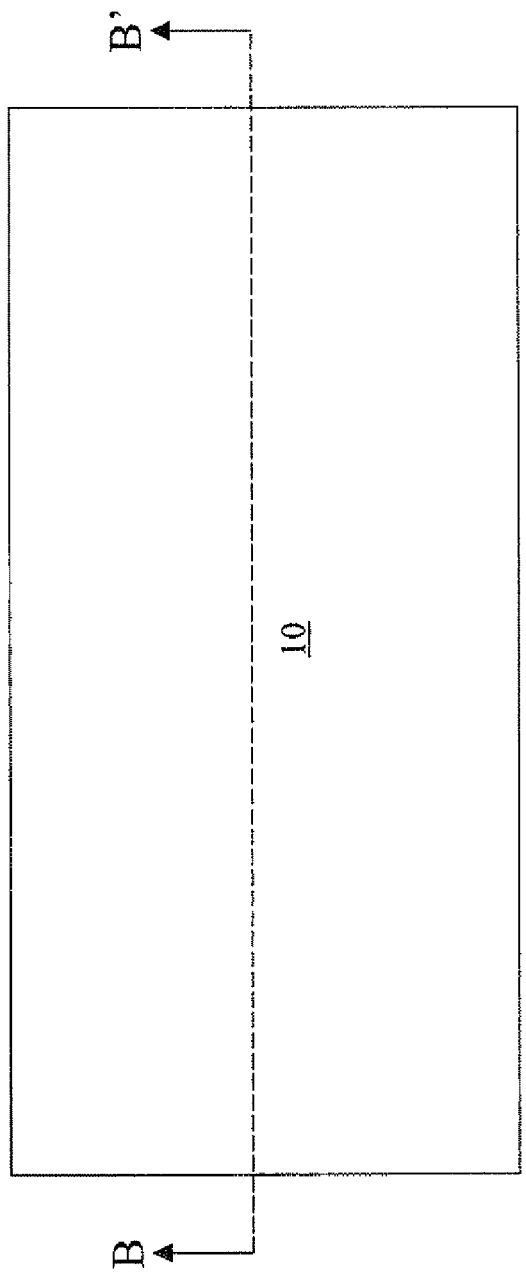
Figure 2B:
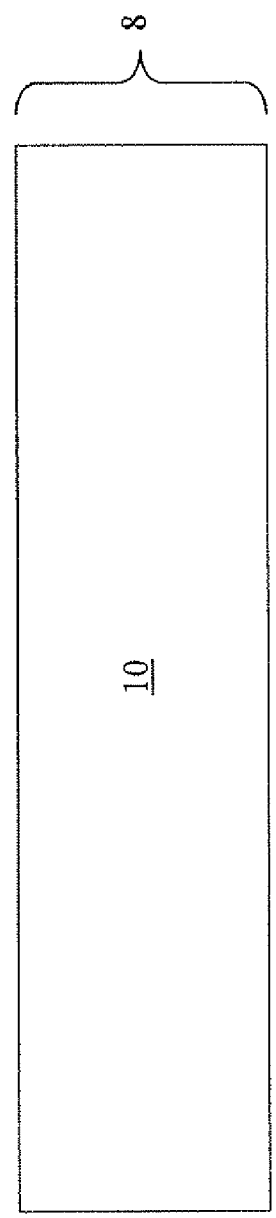

Referring to FIGS. 2A and 2B, an exemplary semiconductor structure according to the present invention comprises a semiconductor substrate 8 containing a substrate layer 10. The portion of the semiconductor substrate 8 containing a semiconductor material constitutes the substrate layer 10. The substrate layer 10 may comprise a semiconductor material such as amorphous silicon, epitaxial silicon, single crystal silicon, silicon germanium alloy, silicon carbon alloy, silicon carbon germanium alloy, a III-V compound semiconductor, or a II-VI compound semiconductor. The semiconductor material may be substantially undoped, doped with p-type dopants, or doped with n-type dopants.

The semiconductor substrate 8 may be a bulk substrate, a semiconductor-on-insulator (SOI) substrate, or a hybrid substrate. The semiconductor substrate 8 may have a built-in biaxial stress in the plane of the semiconductor substrate 8, i.e., in the plane perpendicular to the surface normal of the top surface of the semiconductor substrate 8. While the present invention is described with a bulk substrate, implementation of the present invention on an SOI substrate or on a hybrid substrate is explicitly contemplated herein.

Figure 3A:
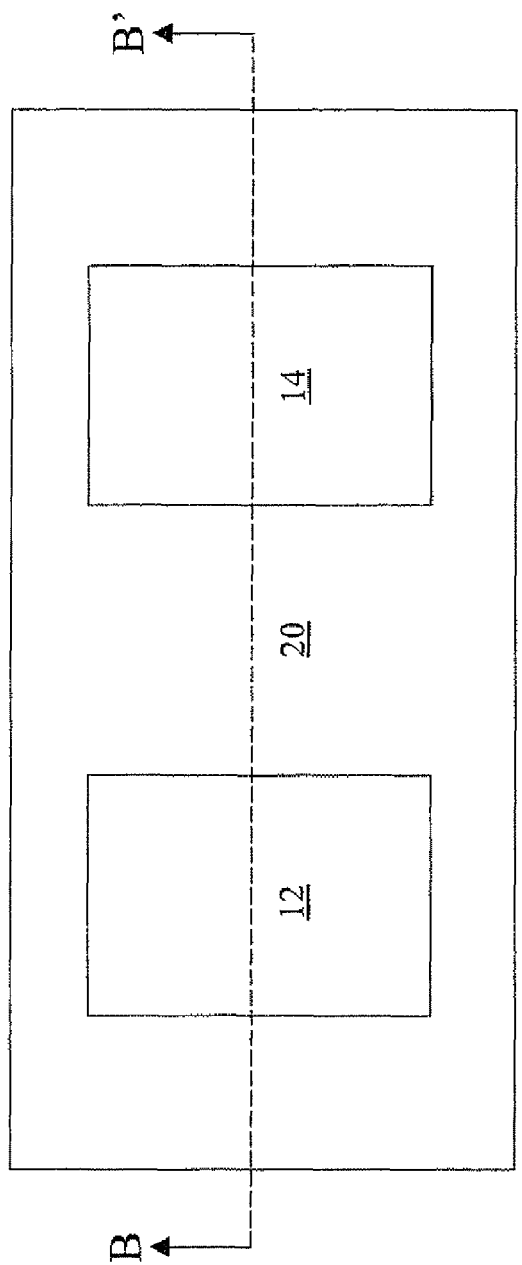
Figure 3B:
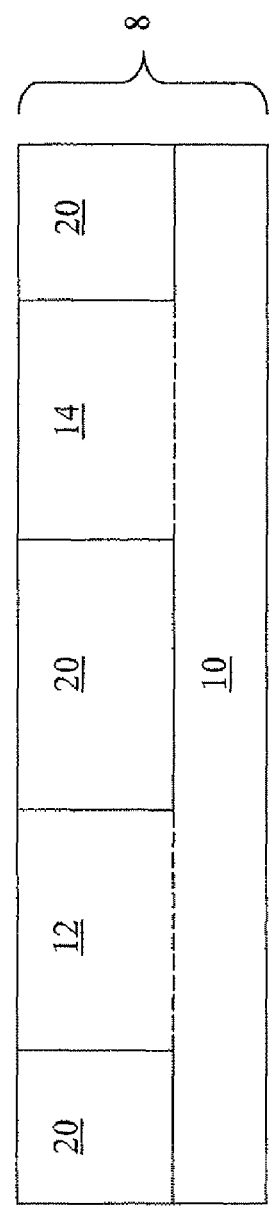

Referring to FIGS. 3A and 3B, shallow trench isolation 20 is formed in the semiconductor substrate by etching a top portion of the substrate layer 10 and filling the etched portion with a dielectric material such as silicon oxide. Optionally, a dielectric liner (not shown) may be employed prior to filling the etched portion with the dielectric material. The height of the shallow trench isolation 20 is from about 100 nm to about 500 nm, and typically from about 150 nm to about 400 nm, although lesser and greater dimensions for the height of the shallow trench isolation 20 are contemplated.

The pattern in the shallow trench isolation 20 is formed such that two regions of exposed semiconductor material are formed in the semiconductor substrate. One region is herein referred to as an "anode semiconductor region" 12, and the other region is herein referred to as a "cathode semiconductor region" 14. Each of the anode semiconductor region 12 and the cathode semiconductor region 14 is laterally surrounded, or laterally encircled, by the shallow trench isolation 20. For the purpose of description of the present invention, the anode semiconductor region 12 and the cathode semiconductor region 14 refer to the two semiconductor portions of the semiconductor substrate 8 located above a bottom surface of the shallow trench isolation 20 and surrounded by sidewalls of the shallow trench isolation 20. The shapes of the anode semiconductor region 12 and the cathode semiconductor region 14 may be elliptical, circular, and/or polygonal as seen in a top-down view such as FIG. 3A. In particular, the shapes of the anode semiconductor region 12 and the cathode semiconductor region 14 may be rectangular. The anode semiconductor region 12 and the cathode semiconductor region 14 comprise the same material as the substrate layer 10.

Figure 4A:
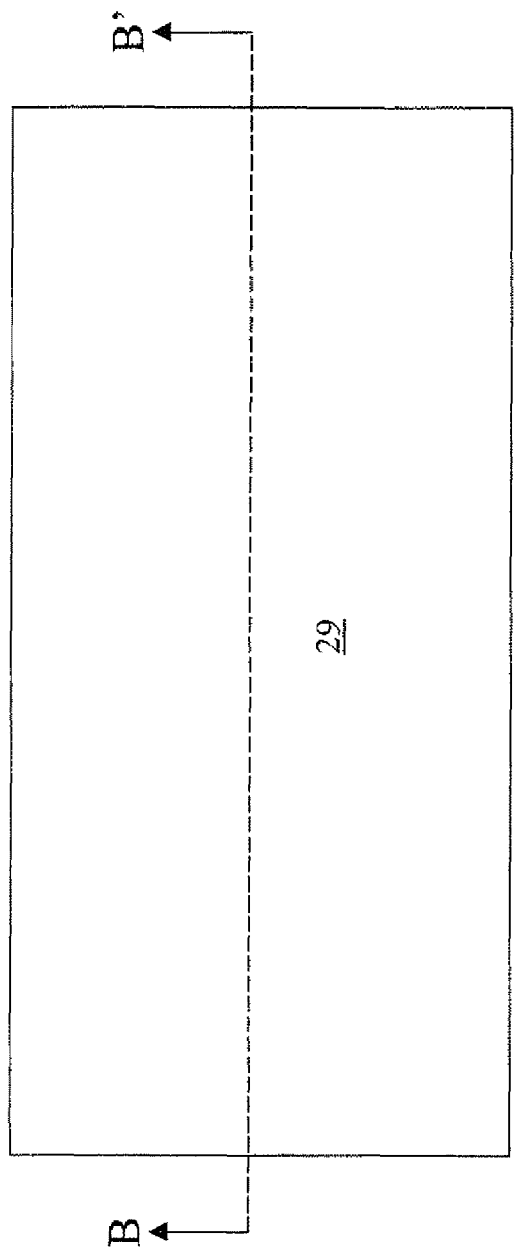
Figure 4B:
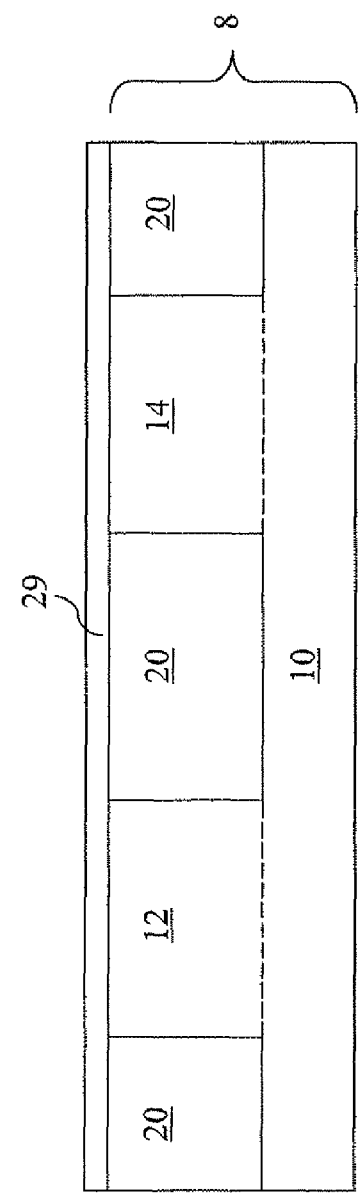

Referring to FIGS. 4A and 4B, a thin semiconductor layer 29 is formed on the semiconductor substrate 8. The thin semiconductor layer 29 comprises another semiconductor material such as amorphous silicon, polysilicon, silicon germanium alloy, silicon carbon alloy, silicon carbon germanium alloy, a III-V compound semiconductor, or a II-VI compound semiconductor. The semiconductor material of the thin semiconductor layer 29 may be substantially undoped, doped with p-type dopants, or doped with n-type dopants. The thickness of the thin semiconductor layer 29 may be from about 2.5 nm to about 20 nm. The semiconductor material may be amorphous or polycrystalline.

The thin semiconductor layer 29 may be formed by chemical vapor deposition, chemical vapor deposition followed by a partial etchback, molecular beam deposition, thermal evaporation, alternating layer deposition, physical vapor deposition, or a combination thereof. The thin semiconductor layer 29 may be deposited at a desired target thickness, or alternately, deposition of a thicker layer of the semiconductor material followed by a partical etchback by a reactive ion etch or a wet etch may be employed to form the thin semiconductor layer 29 having the desired target thickness.

Figure 5A:
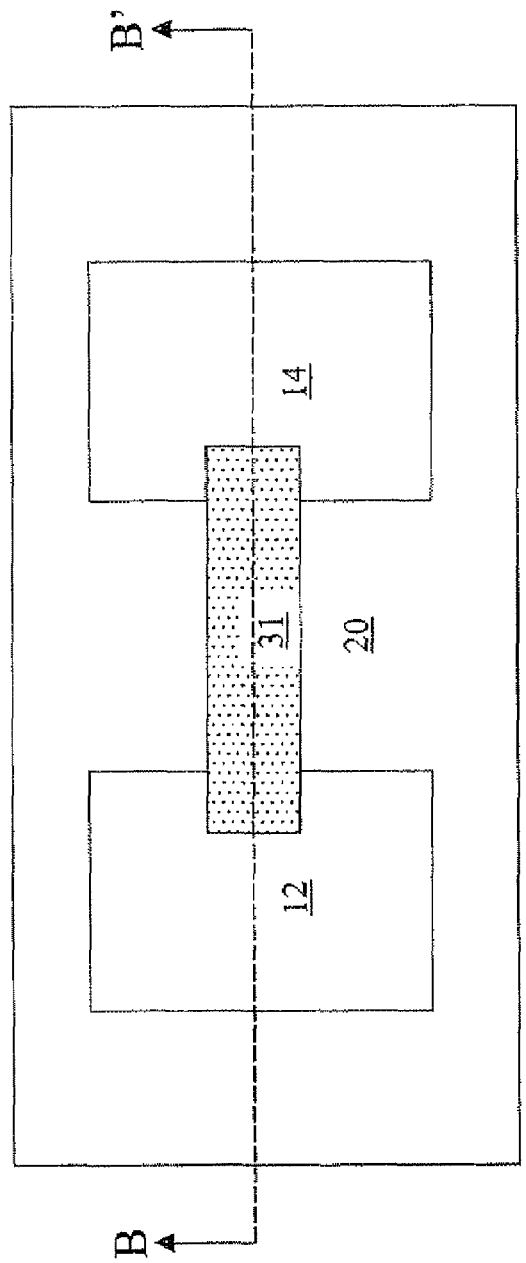
Figure 5B:
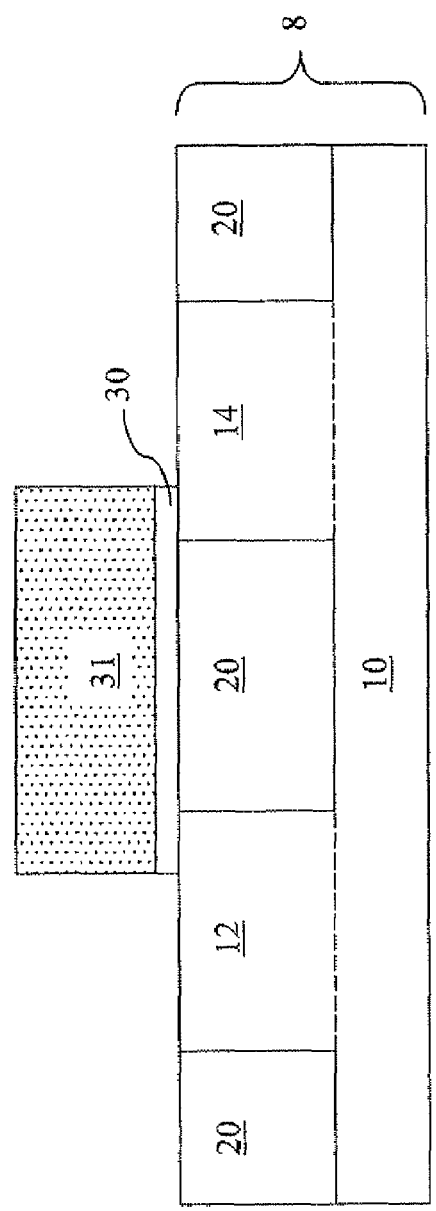

Referring to FIGS. 5A and 5B, the thin semiconductor layer 29 is lithographically patterned and etched to form a semiconductor fuselink 30. Specifically, a photoresist 31 is applied to the thin semiconductor layer 29 and lithographically patterned to cover a portion of the shallow trench isolation 20 between the anode semiconductor region 12 and the cathode semiconductor region 14. The remaining portion of the photoresist 31 after patterning extends over a portion of the anode semiconductor region 12 and a portion of the cathode semiconductor region 14. The thin semiconductor layer 29 is etched selective to the shallow trench isolation 20 and the semiconductor material of the anode semiconductor region 12 and the cathode semiconductor region 14. The remaining portion of the thin semiconductor layer 29 constitutes the semiconductor fuselink 30.

The semiconductor fuselink 30 spans across the portion of the shallow trench isolation 20 between the anode semiconductor region 12 and the cathode semiconductor region 14. The semiconductor fuselink 30 overlaps with a portion of the anode semiconductor region 12 and a portion of the cathode semiconductor region 14 in a top-down view. The width of the semiconductor fuselink 30, or the dimension of the semiconductor fuselink 30 along the direction perpendicular to the direction of the plane B-B' in FIG. 5A, may be a lithographic minimum length or a dimension thereabout.

Figure 6A:
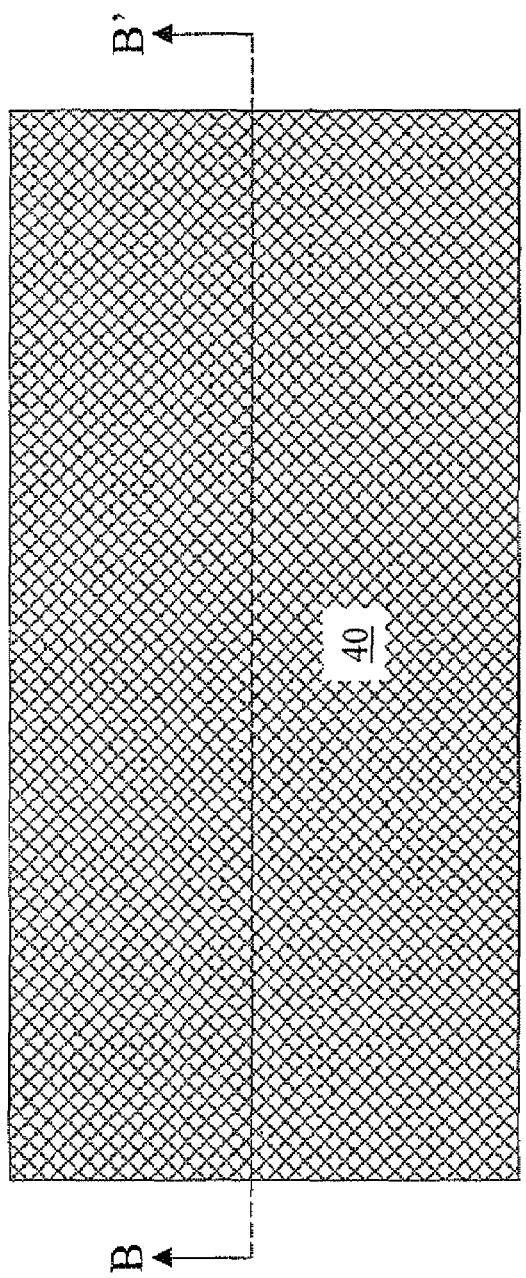
Figure 6B:
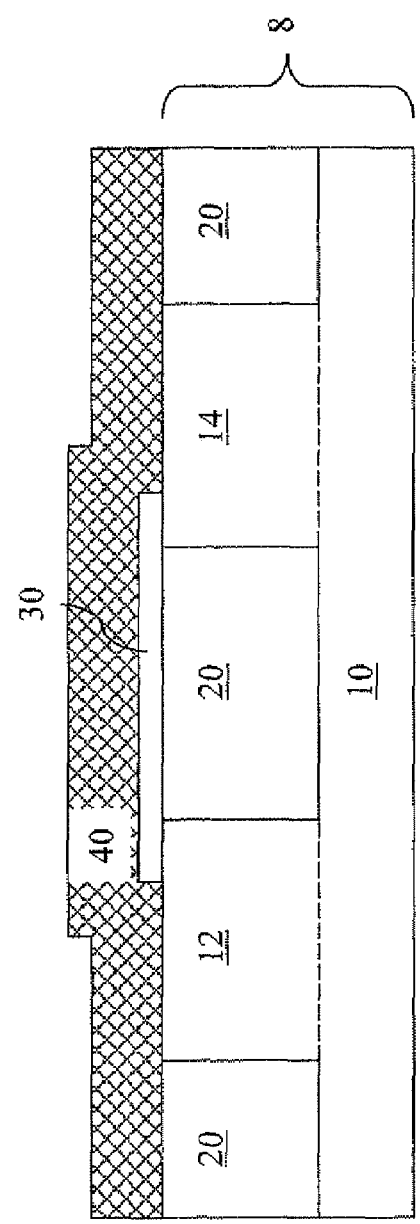

Referring to FIGS. 6A and 6B, a metal layer 40 is deposited directly on the semiconductor fuselink 30 and the semiconductor substrate 8. The metal layer 40 comprises a metal capable of forming a metal semiconductor alloy with the semiconductor material of the semiconductor fuselink 30, the anode semiconductor region 12, and the cathode semiconductor region 14. For example, the metal may be tungsten, tantalum, titanium, cobalt, nickel, platinum, osmium, another elemental metal, or an alloy thereof.

The metal may, or may not, have multiple metal semiconductor alloy phases having different compositions. For example, the metal may form different semiconductor alloys with the semiconductor material, i.e., a first metal semiconductor alloy having a first silicon to metal ratio and a second metal semiconductor alloy having a second silicon to metal ratio, in which the first ratio is different from the second ratio. In a first exemplary case, the metal may be Ni, the semiconductor material may be silicon, the first metal semiconductor alloy may be $Ni_2Si$, and the second metal semiconductor alloy may be NiSi, the first silicon to metal ratio being 0.5 and the second silicon to metal ratio being 1. In a second exemplary case, the metal may be Os, the semiconductor material may be silicon, the first metal semiconductor alloy may be OsSi, and the second metal semiconductor alloy may be $Os_2Si_3$, the first silicon to metal ratio being 1 and the second silicon to metal ratio being 1.5. In a third exemplary case, the metal may be Co, the semiconductor material may be silicon, the first metal semiconductor alloy may be CoSi, and the second metal semiconductor alloy may be $CoSi_2$, the first silicon to metal ratio being 1 and the second silicon to metal ratio being 2. In a fourth exemplary case, the metal may be Ti, the semiconductor material may be silicon, the first metal semiconductor alloy may be TiSi, and the second metal semiconductor alloy may be TiSi$_2$, the first silicon to metal ratio being 1 and the second silicon to metal ratio being 2.

A preferred thickness of the metal layer 40 ranges from about 5 nm to about 50 nm, more preferably from about 10 nm to about 25 nm. The thickness of the metal layer 40 is such that all of the semiconductor material in the semiconductor fuselink 30 is consumed during a subsequent metallization process to from a metal semiconductor alloy. The metal layer 40 can be readily deposited by any suitable deposition technique, including, but not limited to: atomic layer deposition (ALD), chemical vapor deposition (CVD), and physical vapor deposition (PVD). Optionally, a metal nitride capping layer (not shown) may be deposited over the metal layer 40. The metal nitride capping layer may contain a refractory metal nitride such as TaN, TiN, OsN and has a thickness ranging from about 5 nm to about 50 nm, preferably from about 10 nm to about 30 nm.

Referring to FIGS. 7A and 7B, the exemplary semiconductor structure is thereafter annealed at a pre-determined elevated temperature at which the metal layer 40 reacts with the semiconductor material of the semiconductor fuselink 30, the anode semiconductor region 12, and the cathode semiconductor region 14 to form various metal semiconductor alloys in a metallization process. The annealing is typically performed in an inert gas atmosphere, e.g., He, Ar, N$_2$, or forming gas, at a temperature that is conducive to formation of the first metal semiconductor alloy. Typically, the first metal semiconductor alloy is formed at relatively low temperatures compared with the temperatures for formation of the second metal semiconductor alloy, which is avoided at this stage. The temperature for formation of the first metal semiconductor alloy depends on the first metal semiconductor alloy, and ranges from about 100° C. to about 600° C., typically from about 300° C. to about 500° C., and most typically from about 300° C. to about 450° C. A continuous heating at a constant temperature or various ramping in temperature may be employed.

During the metallization process, upper portions of the anode semiconductor region 12 and the cathode semiconductor region 14 react with the metal layer 40 to form a metal semiconductor alloy anode 52 and a metal semiconductor alloy cathode 54, respectively. Consequently, the metal semiconductor alloy anode 52 and the metal semiconductor alloy cathode 54 comprise a metal semiconductor alloy derived from the metal of the metal layer 40. The semiconductor material in the semiconductor fuselink 30 fully reacts with the metal layer 40 to form a metal semiconductor alloy fuselink 50. In other words, all of the semiconductor material in the semiconductor fuselink 30 is consumed during the metallization by reacting with the metal layer 40 so that no semiconductor material remains over the shallow trench isolation 20. Instead, the newly formed metal semiconductor alloy fuselink 50 comprises another metal semiconductor alloy derived from the metal of the metal layer 40.

The metal semiconductor alloy anode 52 and the metal semiconductor alloy cathode 54 have a first thickness t1, and the metal semiconductor alloy fuselink 50 has a second thickness t2, which is less than the first thickness t1. The second thickness t2 is limited by the thickness of the semiconductor fuselink 30 since supply of the metal from the metal layer 40 is more than enough to metallize all of the semiconductor material in the semiconductor fuselink 30. The first thickness t1 is limited by the thickness of the metal layer 40 and thermal cycling during the metallization process. Since formation of the metal semiconductor alloy fuselink 50 is limited by supply of metal from the metal layer 40, the metal semiconductor alloy fuselink 50 tends to be metal rich. On the contrary, the formation of the metal semiconductor alloy anode 52 and the metal semiconductor alloy cathode 54 may be limited by supply of metal from the metal layer and/or by thermal cycling of the metallization process, the metal semiconductor alloy anode 52 and the metal semiconductor alloy cathode 54 may be semiconductor rich. Thus, the metal semiconductor alloy fuselink 50 may be richer in metal than the metal semiconductor alloy anode 52 and the metal semiconductor alloy cathode 54.

The first thickness may be from about 15 nm to about 50 nm, and said second thickness may be from about 5 nm to about 30 nm, although lesser and greater thicknesses are also contemplated.

Due to volume expansion during the metallization process, top surfaces of the metal semiconductor alloy anode 52 and the metal semiconductor alloy cathode 54 may be located above top surfaces of the shallow trench isolation 20. Also, the volume of the metal semiconductor alloy fuselink 50 is greater than the volume of the semiconductor fuselink 30. In particular, the second thickness is greater than the thickness of the semiconductor fuselink 30. After the metallization process, unreacted portions of the metal layer 40 are removed, for example, by a wet etch.

Optionally, a second anneal may be performed to change the phase of the metal semiconductor alloy anode 52 and the metal semiconductor alloy cathode 54 into a more semiconductor rich phase. In the first exemplary case, a metal silicide having a Ni$_2$Si phase may be further annealed to form a NiSi phase. In the second exemplary case, a metal silicide having an OsSi phase may be further annealed to form an Os$_2$Si$_3$ phase. In the third exemplary case, a metal silicide having a CoSi phase may be further annealed to form a CoSi$_2$ phase. In the fourth exemplary case, a metal silicide having a TiSi phase may be further annealed to form a TiSi$_2$ phase.

Typically, the formation of the various metal semiconductor alloys (50, 52, 54) are performed at the same processing step as formation of other metal semiconductor alloys such as source and drain contacts of a transistor. The first thickness t1 is the thickness of other metal semiconductor alloys formed on other portions of the semiconductor substrate 8.

The metal semiconductor alloy anode 52, the metal semiconductor alloy cathode 54, and the metal semiconductor alloy fuselink 50 collectively constitute an inventive electrical fuse (50, 52, 54). Since the second thickness t2 of the metal semiconductor alloy fuselink 50 is less than the first thickness t1, the inventive electrical fuse (50, 52, 54) contains the metal semiconductor alloy fuselink 50 having a smaller cross-sectional area compared with a conventional electrical fuse having a comparable with in a fuselink. During programming of the inventive electrical fuse (50, 52, 54), current density in the metal semiconductor alloy fuselink 50 is increased due to the smaller cross-sectional area. Further, the change in the cross-sectional area for a current path is greater between the metal semiconductor alloy fuselink 50 and each of the metal semiconductor alloy anode 52, the metal semiconductor alloy cathode 54, thus increasing the divergence of current during programming. Both of these features may contribute to enhanced programming of the inventive electrical fuse (50, 52, 54) and/or reduction of required programming current for the inventive electrical fuse (50, 52, 54). Further, reduced contact area with surrounding dielectric materials decreases heat loss during programming of the inventive electrical fuse (50, 52, 54) to facilitate programming.

Referring to FIGS. 8A and 8B, a middle-of-line (MOL) dielectric layer 60 is formed on the inventive electrical fuse (50, 52, 54) and on the semiconductor substrate 8. The MOL dielectric layer 60 vertically abuts top surfaces of the metal semiconductor alloy fuselink 50, the metal semiconductor alloy anode 52, the metal semiconductor alloy cathode 54, and the shallow trench isolation 20. The MOL dielectric layer 60 may comprise a silicon oxide, a silicon nitride, a chemical vapor deposition (CVD) low-k dielectric material, or a spin-on low-k dielectric material.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes are formed in the MOL dielectric layer 60 and filled with metal to form various metal contacts. Specifically, at least one anode contact via 72 vertically abutting the metal semiconductor alloy anode 52 and at least one cathode contact via 74 vertically abutting the metal semiconductor alloy cathode 54 may be formed.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a metal semiconductor alloy anode having a first thickness and vertically abutting a substrate layer in a semiconductor substrate;
   a metal semiconductor alloy cathode having said first thickness and vertically abutting said substrate layer;
   shallow trench isolation located in said semiconductor substrate and laterally abutting said metal semiconductor alloy anode and said metal semiconductor alloy cathode, wherein said shallow trench isolation separates said metal semiconductor alloy anode from said metal semiconductor alloy cathode; and
   a metal semiconductor alloy fuselink having a second thickness and vertically abutting said shallow trench isolation, said metal semiconductor alloy anode, and said metal semiconductor alloy cathode, wherein said first thickness is greater than said second thickness.

2. The semiconductor structure of claim 1, wherein said metal semiconductor alloy anode and said metal semiconductor alloy cathode comprise the same first metal semiconductor alloy.

3. The semiconductor structure of claim 2, wherein said metal semiconductor alloy fuselink comprises a second metal semiconductor alloy, wherein said first metal semiconductor alloy and said second metal semiconductor alloy are derived from the same metal and the same semiconductor.

4. The semiconductor structure of claim 3, wherein said second metal semiconductor alloy is more metal rich than said first metal semiconductor alloy.

5. The semiconductor structure of claim 1, wherein said substrate layer comprises single crystalline silicon and each of said metal semiconductor alloy anode, said metal semiconductor alloy cathode, and said metal semiconductor alloy fuselink comprises a metal silicide.

6. The semiconductor structure of claim 5, wherein said metal silicide is selected from tungsten silicide, tantalum silicide, titanium silicide, cobalt silicide, nickel silicide, platinum silicide, osmium silicide, a silicide of other elemental metal, and an alloy thereof.

7. The semiconductor structure of claim 1, wherein said substrate layer comprises single crystalline silicon-germanium alloy and each of said metal semiconductor alloy anode, said metal semiconductor alloy cathode, and said metal semiconductor alloy fuselink comprise a metal silicide-germanide alloy.

8. The semiconductor structure of claim 1, wherein said substrate layer comprises single crystalline silicon-carbon alloy and each of said metal semiconductor alloy anode, said metal semiconductor alloy cathode, and said metal semiconductor alloy fuselink comprise a metal silicide-carbide alloy.

9. The semiconductor structure of claim 1, wherein said first thickness is from about 15 nm to about 50 nm, and said second thickness is from about 5 nm to about 30 nm.

10. The semiconductor structure of claim 1, further comprising:
    a middle-of-line (MOL) dielectric layer vertically abutting said metal semiconductor alloy anode, said metal semiconductor alloy cathode, said metal semiconductor alloy fuselink, and said shallow trench isolation;
    at least one anode contact via vertically abutting said metal semiconductor alloy anode; and
    at least one cathode contact via vertically abutting said metal semiconductor alloy cathode.

11. A method of forming a semiconductor structure comprising:
    forming shallow trench isolation in a semiconductor substrate and two regions of exposed semiconductor material surrounded by said shallow trench isolation;
    forming a semiconductor fuselink on a portion of said shallow trench isolation between said two regions;
    forming a metal semiconductor alloy anode having a first thickness and a metal semiconductor alloy cathode having said first thickness by metallizing portions of said two regions; and
    converting said semiconductor fuselink into a metal semiconductor alloy fuselink having a second thickness by completely metallizing said semiconductor fuselink, wherein said first thickness is greater than said second thickness.

12. The method of claim 11, wherein said forming of said metal semiconductor alloy anode and said metal semiconductor alloy cathode is performed at the same processing steps as said converting of said semiconductor fuselink into said metal semiconductor alloy fuselink.

13. The method of claim 11, wherein said forming of said semiconductor fuselink comprises:
    depositing a semiconductor layer on said semiconductor substrate by a blanket deposition; and
    lithographically patterning and etching said semiconductor layer.

14. The method of claim 13, wherein said depositing of said semiconductor layer is performed by at least one of the processes selected from chemical vapor deposition, chemical vapor deposition followed by a partial etchback, molecular beam deposition, thermal evaporation, alternating layer deposition, and physical vapor deposition.

15. The method of claim 11, wherein said metal semiconductor alloy anode and said metal semiconductor alloy cathode comprise the same first metal semiconductor alloy.

16. The method of claim 15, wherein said metal semiconductor alloy fuselink comprises a second metal semiconductor alloy, wherein said first metal semiconductor alloy and said second metal semiconductor alloy are derived from the same metal and the same semiconductor.

17. The method of claim 16, wherein said second metal semiconductor alloy is more metal rich than said first metal semiconductor alloy.

18. The method of claim 11, further comprising depositing a metal layer on said semiconductor fuselink and said two regions, wherein said metal layer is thick enough to consume all of said semiconductor fuselink during said converting of said semiconductor fuselink.

19. The method of claim 11, wherein said substrate layer comprises single crystalline silicon and each of said metal semiconductor alloy anode, said metal semiconductor alloy cathode, and said metal semiconductor alloy fuselink comprises a metal silicide.

20. The method of claim 11, further comprising:

forming a middle-of-line (MOL) dielectric layer directly on said metal semiconductor alloy anode, said metal semiconductor alloy cathode, said metal semiconductor alloy fuselink, and said shallow trench isolation;

forming at least one anode contact via vertically abutting said metal semiconductor alloy anode; and forming at least one cathode contact via vertically abutting said metal semiconductor alloy cathode.

* * * * *